United States Patent [19]
Imaseki

[11] Patent Number: 5,631,533
[45] Date of Patent: May 20, 1997

[54] CHARGING AND DISCHARGING CONTROL DEVICE FOR SECONDARY BATTERY

[75] Inventor: Takashi Imaseki, Zushi, Japan

[73] Assignee: Nissan Motor Co., Ltd., Kanagawa-ken, Japan

[21] Appl. No.: 405,054

[22] Filed: Mar. 15, 1995

[30] Foreign Application Priority Data

Mar. 15, 1994 [JP] Japan ................. 6-070039

[51] Int. Cl.$^6$ .................................. H01M 10/46
[52] U.S. Cl. ................. 320/5; 320/39; 320/48
[58] Field of Search ................. 320/5, 6, 9, 12, 320/13, 15, 30, 39, 48, 43

[56] References Cited

U.S. PATENT DOCUMENTS 5,371,682  12/1994  Levine et al. ............... 320/48 X
5,394,089  2/1995  Clegg ......................... 320/48 X

FOREIGN PATENT DOCUMENTS 63-55868  3/1988  Japan.

*Primary Examiner*—Peter S. Wong
*Assistant Examiner*—E. Tso
*Attorney, Agent, or Firm*—Lowe, Price, LeBlanc & Becker

[57] ABSTRACT

A charging and discharging control device for a secondary battery includes a secondary battery, a controller, a charging unit for charging the battery, a ON/OFF switch between the battery and the charging unit and a control switch for controlling the discharge current. At charging the battery, the ON/OFF switch is turned on and a voltage Ve of the secondary battery is compared with a charge stop voltage Vmax by the controller. If Ve≧Vmax, the charging operation is ended. At discharging, the control is turned on and the voltage Ve is compared with a discharge stop voltage Vmin. If Ve≦Vmin, the discharging operation is ended. Corresponding to charging/discharging history of the battery, the controller corrects the voltage Vmin so as to be increased and the voltage Vmax so as to be decreased, whereby the life span of the secondary battery can be extended.

5 Claims, 8 Drawing Sheets

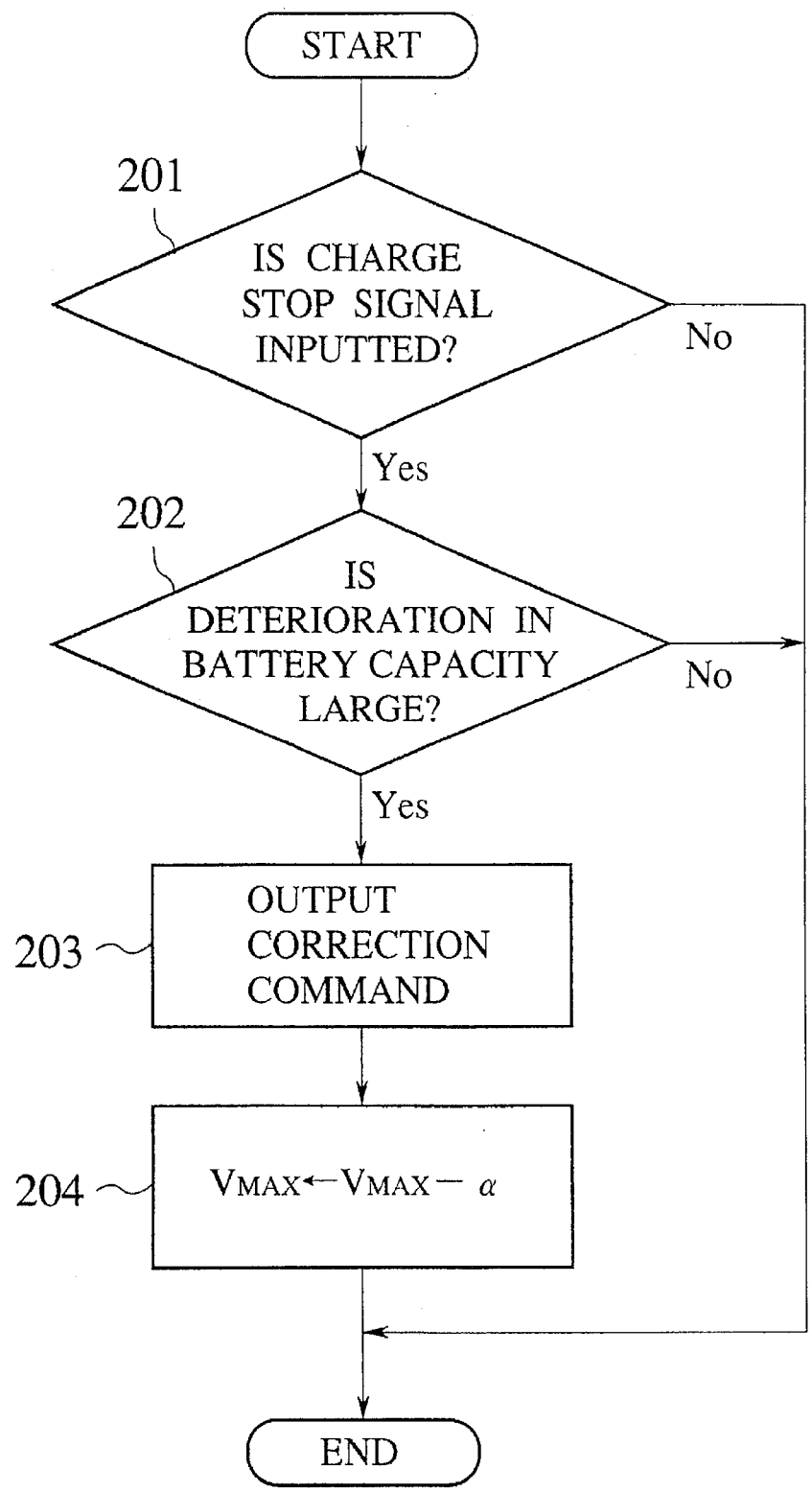

CHARGING AND DISCHARGING CONTROL DEVICE FOR SECONDARY BATTERY

BACKGROUND OF THE INVENTION

1. Field of the Invention

The present invention relates to a charging and discharging control device for extending a cycle life of a secondary battery.

2. Description of Related Art

In Japanese Unexamined Patent Publication (Kokai) No.63-55868, there is disclosed a conventional charging and discharging control device for the secondary battery, which controls the charging and discharging operations of the battery upon a previous establishment of predetermined reference values as a charge stop voltage and discharge stop voltage, respectively.

In this conventional device, however, there is a tendency that a deterioration rate of battery-capacity of the secondary battery increases gradually as a number of charging/discharging cycle thereof increases. For example, in case of employing the secondary battery (or batteries) as a battery for driving a motor of vehicle, there is raised a problem that a basic performance of vehicle, such as a traveling range of the vehicle per charging, is abruptly deteriorated as times pass.

Further, under condition that a plurality of secondary batteries are used as a builtup battery and that, at discharging, the discharging operation as the whole builtup battery is stopped by either one discharge-completion signal generated from one secondary battery or limited numbers of discharge-completion signals of specified secondary batteries, it is not possible to make use of energy contained in all of the secondary batteries efficiently due to difference in battery-capacity between respective secondary batteries.

Similarly, because of a difference between individual secondary batteries, there is a problem that the more the battery is deteriorated, the more it shortens the life span of the builtup battery.

SUMMARY OF THE INVENTION

It is therefore an object of the present invention to provide a charging and discharging control device for a secondary battery, which can restain an increasing of deterioration rate in battery capacity influenced by a charging/discharging history of the secondary battery so that the life span of the battery can be extended.

The objects of the invention described above can be accomplished by a charging and discharging control device for a secondary battery, the control device comprising:

discharging control means for stopping discharging of the secondary battery when a voltage thereof becomes to be less than a predetermined discharge stop voltage during discharging of the secondary battery;

charging control means for stopping charging of the secondary battery when the voltage thereof is in excess of a predetermined charge stop voltage during charging of the secondary battery; and history estimating means for estimating the charging/discharging history of the secondary battery on the basis of condition thereof.

In the present invention, the discharging control means corrects the predetermined discharge stop voltage so as to be increased corresponding to the charging/discharging history estimated by the history estimating means and the charging control means corrects the predetermined charge stop voltage so as to be decreased corresponding to the charging/discharging history estimated by the history estimating means.

With the above-mentioned arrangement, the gradual increasing of the deterioration rate in battery capacity can be alleviated, whereby the life span of the secondary battery can be extended in comparison with that of the conventional device.

Other objects and features of the present invention will become more fully apparent from the following description and appended claims taken in conjunction with the accompanying drawings.

BRIEF DESCRIPTION OF THE DRAWING

FIG. 10 is a flow chart of a correcting operation of the charge stop voltage, which is executed by the control device of FIG. 8.

DESCRIPTION OF THE PREFERRED EMBODIMENT

Embodiments of the present invention are now described with reference to the drawings.

Figure 1:
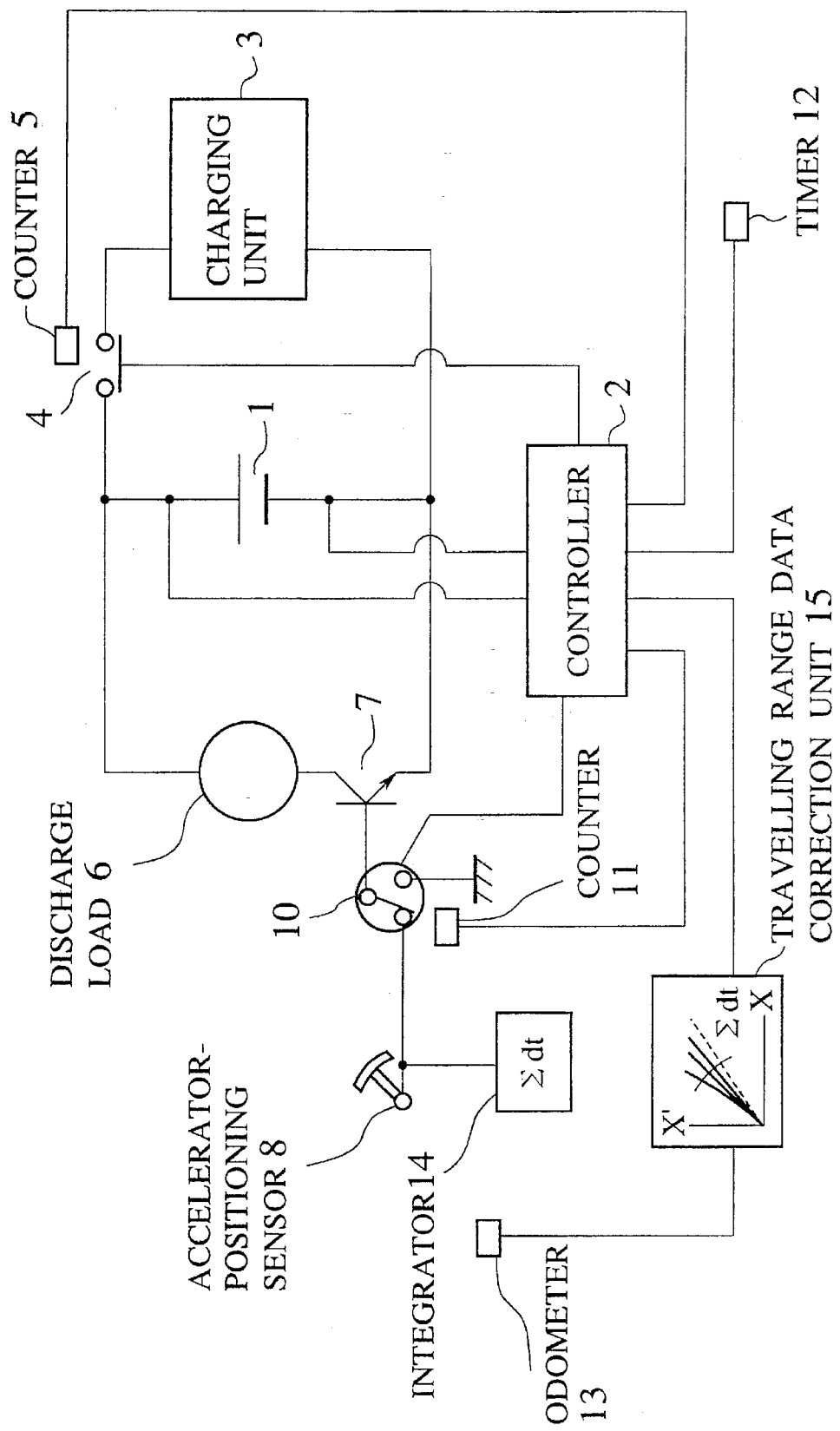
FIG. 1 is a view showing a charging and discharging control device in accordance with an embodiment of the present invention.

FIG. 1 shows a charging and discharging control device in accordance with the first embodiment of the present invention, which is applied for a secondary battery used as a battery for driving an electrical automobile which is not shown in the figure.

In FIG. 1, a secondary battery 1 is electrically connected to a controller 2, so that a voltage Ve of the battery 1 is inputted to the controller 2. A charging unit 3 is also connected to the secondary battery 1 through the intermediary of a ON/OFF switch 4. In the vicinity of the ON/OFF switch 4, a counter 5 is arranged to count the times of ON/OFF action in the switch 4. Note, the operation of the ON/OFF switch 4 is controlled by the controller 2.

Further connected to the secondary battery 1 is a discharge load 6, such as a not shown drive motor, about which a control switch 7 consisting of a transistor is arranged to control the discharging current. An accelerator-positioning sensor 8 for detecting a position of accelerator pedal is electrically connected to the control switch 7. Arranged between the control switch 7 and the accelerator-positioning sensor 8 is a signal change-over switch 10 which is controlled by the controller 2 and to which a counter 11 is attached to count the number of times of change-over operation in the signal change-over switch 10.

A timer 12 is arranged to detect a passage of time since the secondary battery is exchanged for the new one. Furthermore, the charging and discharging control device of the invention includes an odometer 13, an integrator 14 and a traveling-range data correction unit 15 which corrects the data of traveling range (distance) of the automobile under a severe load-condition with a large acceleration.

All of informations from the counter 5, the other counter 11, the timer 12 and the odometer 13 via. the traveling-range data correction unit 15 are inputted to the controller 2.

Figure 2:
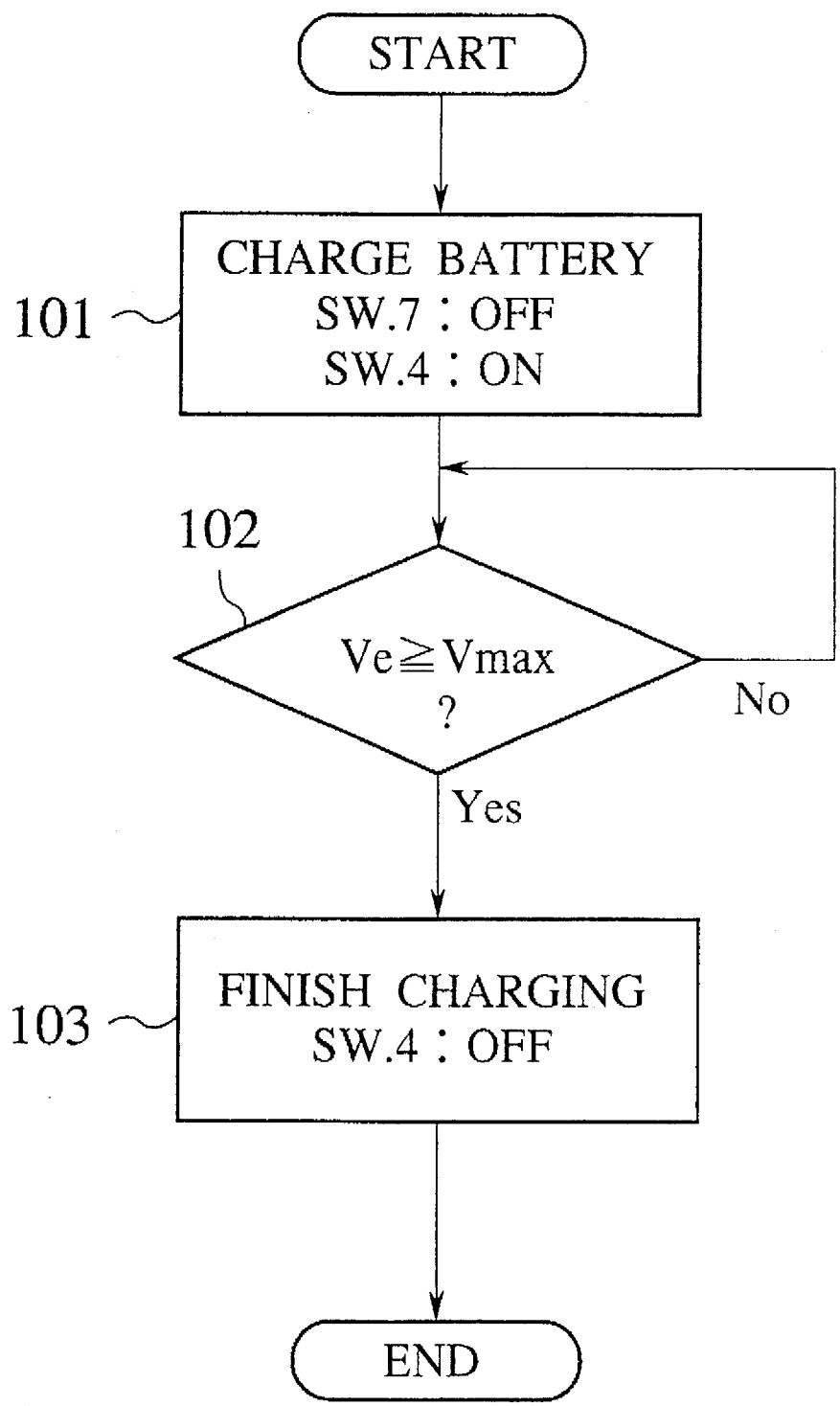
FIG. 2 is a flow chart for executing a charging operation of the control device of FIG. 1.

We now describe a charging operation carried out by the above-constructed control device, with reference to a flow chart shown in FIG. 2.

First of all, at step 101, the control switch 7 for controlling the discharging current is turned off by the controller 2 through the intermediary of the signal change-over switch 10, upon grounding a base plate of transistor thereof. Furthermore, at this step 101, the ON/OFF switch 4 for controlling the charging current is turned on, whereby the charging unit 3 charges the secondary battery 1 with electricity, applying an electric current Ic thereto.

Next, at sequent step 102, a voltage Ve of the secondary battery 1 is detected by the controller 2 and then compared with a charge stop voltage Vmax to stop charging the secondary battery 1. If the judgement at step 102 is Ve≧Vmax, the routine goes to step 103 where the ON/OFF switch 4 is turned off, so that the charging operation of the secondary battery 1 is ended. On the other hand, the judgement at step 102 is No (Ve<Vmax), the routine returns to step 102 where the charging operation is maintained.

According to the embodiment, in the above-mentioned process, the charge stop voltage Vmax is calculated upon considering a so-called charging/discharging history (experience) of the secondary battery 1, which can be estimated on the basis of the present condition of the battery 1 detected by the counters 5 and 11, the timer 12 and the odometer 13.

Figure 3:
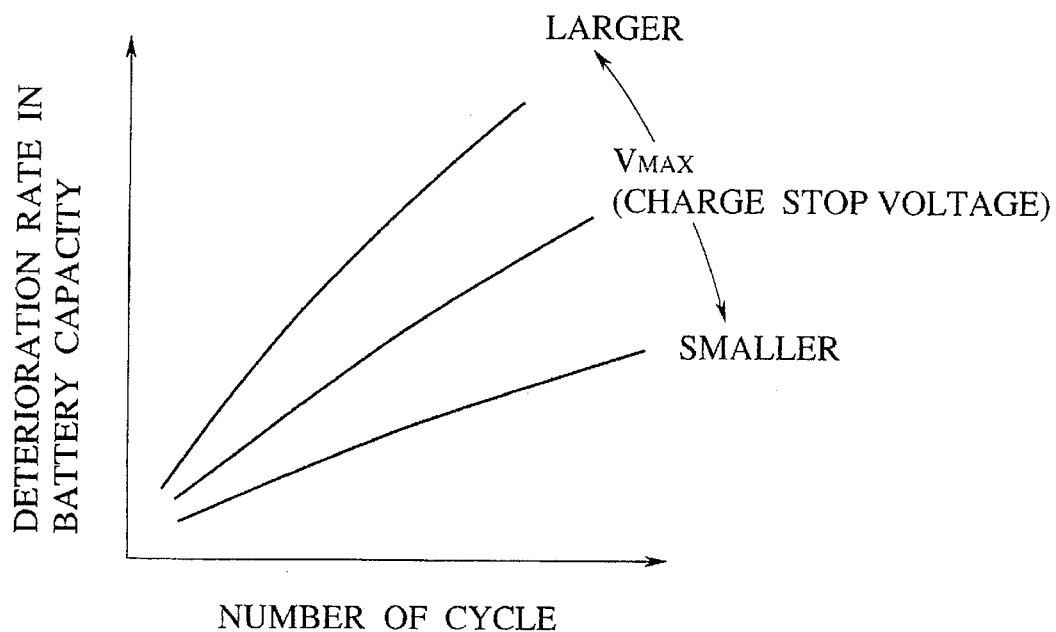
FIG. 3 is a diagram showing a variation of a relationship between a charge stop voltage and a deterioration rate in battery capacity, which is changed by numbers of cycle between charging and discharging.

FIG. 3 shows a relationship between the charge stop voltage Vmax and a deterioration rate in battery capacity in case of increasing the number of cycle which can be obtained by respective counting numbers at the counters 5 and 11. By the figure, it will be easily understood that the deterioration rate in battery capacity increases as the charging/discharging history thereof makes progress, in other words, as the number of charging/discharging cycle increases. Therefore, in case of applying the control device for a vehicle, it is obvious that, if the deterioration rate in battery capacity increases, the traveling range per charging would be reduced.

By the way, according to FIG. 3, it is also understood that this tendency of increasing the deterioration rate is intensified as the charge stop voltage Vmax is increased (higher). Therefore, from this point of view, it appears that it is necessary to control the charge stop voltage Vmax so as to be a predetermined charge stop voltage, for example V0. However, if the charge stop voltage Vmax is always controlled so as to be the above voltage V0 as a constant, the deterioration rate in battery capacity of the secondary battery 1 is gradually increased as the charging/discharging history of the battery 1 makes progress, so that a basic performance of vehicle, such as the traveling range per one charging, is abruptly deteriorated. Therefore, according to the embodiment, the charge stop voltage Vmax is corrected so as to be decreased ( a downward direction in FIG. 3 ) as the charging/discharging history of the secondary battery 1 makes progress.

Figure 4:
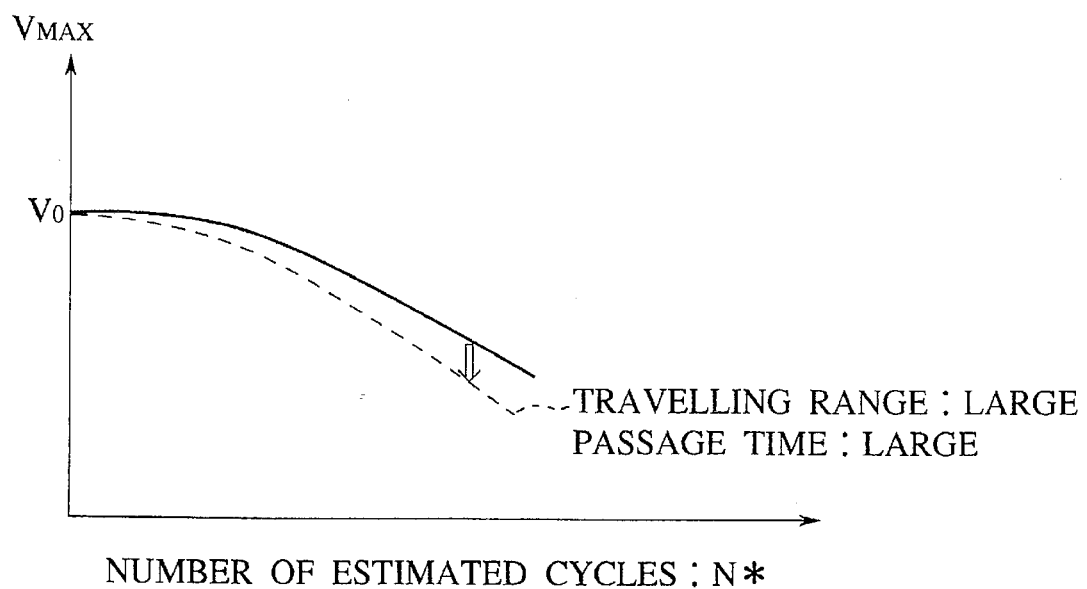
FIG. 4 is a diagram showing one form of correcting the charge stop voltage in accordance with the first embodiment.

We describe how to correct the charge stop voltage Vmax with reference to FIG. 4.

In this embodiment, the above number of charging/discharging cycle of the secondary battery 1 is estimated as the cycle number N* by informations from the counters 5 and 11. Similarly, the traveling range is also estimated by an information from the odometer 13.

Furthermore, making use of the accelerator-positioning sensor 8, the integrator 14 and the traveling range data correction unit 15, when a loaded condition for the secondary battery 1 is severe such that an amount of pedaling is relatively large despite small traveling range, i.e., at a large acceleration, the corrected information in vehicle's traveling range is introduced to the controller 2, whereby a method of making progress of the battery-history under such a severe loaded condition is taken into consideration.

Furthermore, by an information from the timer 12, it is estimated how long it has been passing since the secondary battery 1 is exchanged for the new one.

Then, giving priority to the estimated cycle number, the charge stop voltage Vmax is lowered by a predetermined value as shown with a continuous line of FIG. 3, corresponding to an increasing of the estimated cycle number N*.

When an accumulated value of the traveling range is relatively large in spite of the identical estimated cycle number N, or in case that the passage of time since the battery has been exchanged for the new one is relatively long, a reduction ratio of the charge stop voltage Vmax is further increased as shown with a broken line of FIG. 4.

In this way, even if the charging/discharging history of the battery 1 makes progress, it is possible to avoid the gradual increasing of the deterioration rate in battery capacity, whereby the life span of the secondary battery can be extended.

Figure 5:
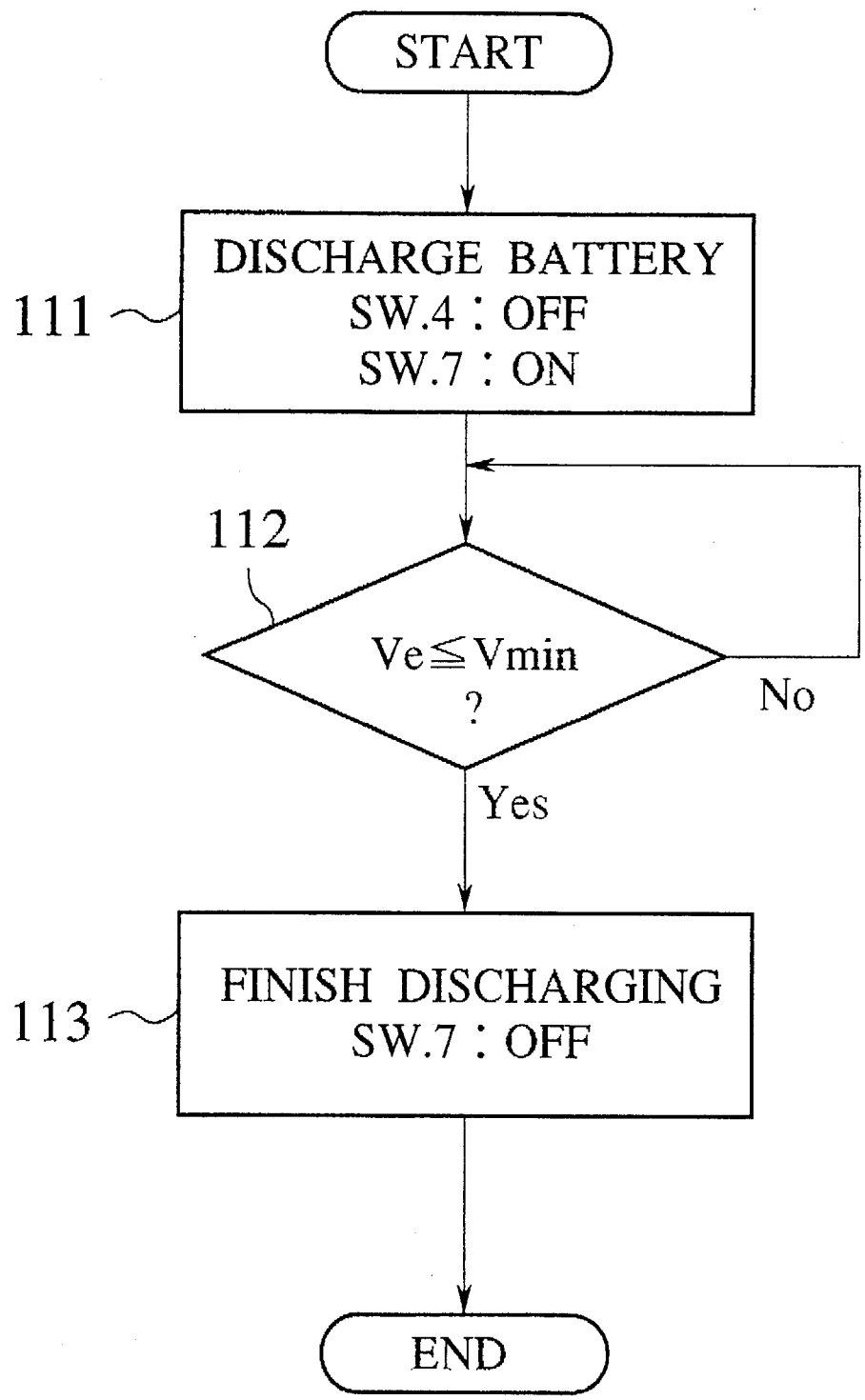
FIG. 5 is a flow chart for executing a discharging operation of the control device of FIG. 1.

Now, we describe a discharging operation of the control device with reference to FIG. 5. Similarly to the charging operation, a discharge stop voltage Vmin at which the discharging operation of the battery is to be stopped, is controlled so as to be increased as the charging/discharging history of the battery 1 makes progress, whereby the above effect can be obtained.

At step 111, the ON/OFF switch 4 is turned off while the switch 7 for controlling the discharging current is turned on, so that an electric current Id in the secondary battery 1 flows through the discharge load 6. Then, at sequent step 112, the voltage Ve of the secondary battery 1 is detected by the controller 2 and then compared with the discharge stop voltage Vmin.

If the judgement at step 112 is Ve≦Vmin, the routine goes to step 113 where the switch 7 is turned off, so that the discharging operation of the secondary battery 1 is ended.

Figure 6:
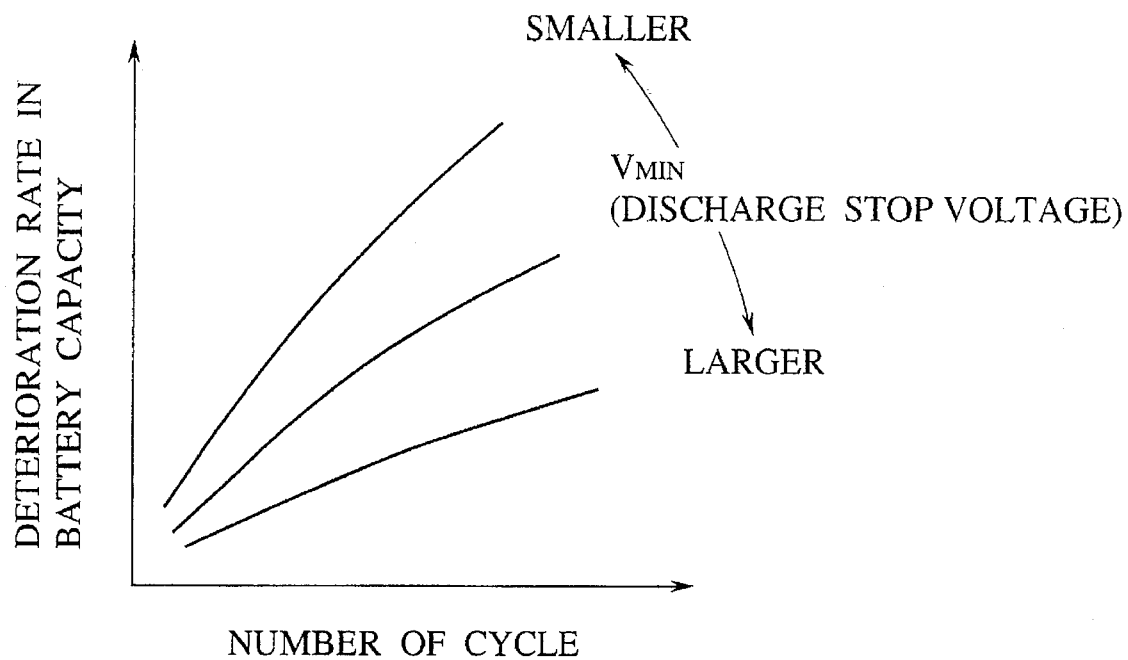
FIG. 6 is a diagram showing a variation of a relationship between a discharge stop voltage and a deterioration rate in battery capacity, which is changed by the numbers of cycle between charging and discharging.
Figure 7:
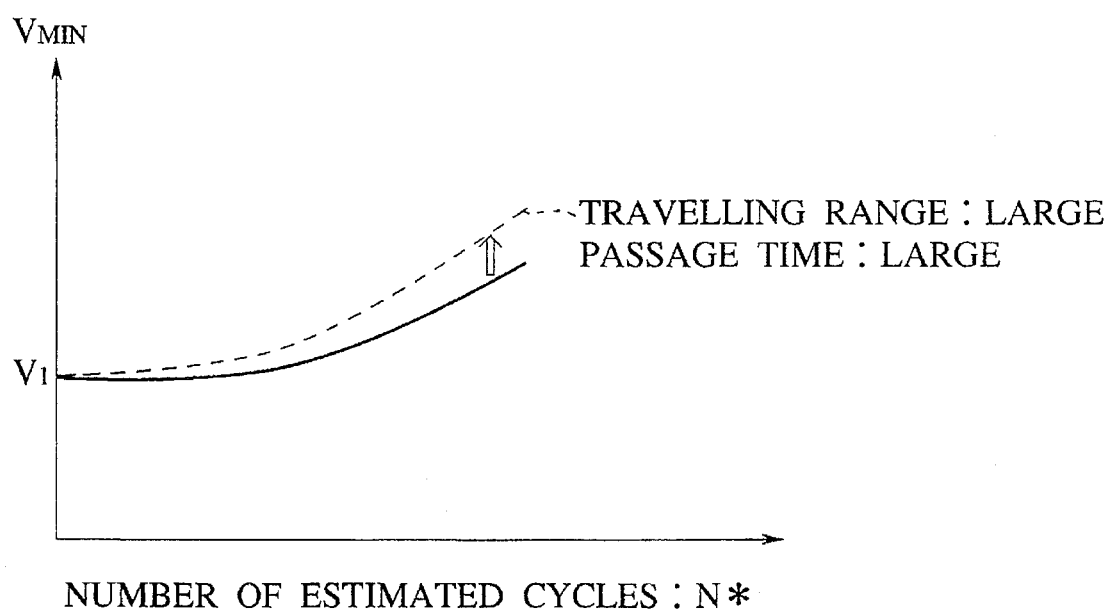
FIG. 7 is a diagram showing one form of correcting the discharge stop voltage in accordance with the first embodiment.

FIG. 6 shows a relationship between the discharge stop voltage Vmin and a deterioration rate in battery capacity as the number of charging/discharging cycle increases. Also in FIG. 6, it will be easily understood that the deterioration rate in battery capacity increases as the charging/discharging history thereof makes progress and that this tendency of increasing the deterioration rate is intensified as the discharge stop voltage Vmin is decreased ( upward direction in FIG. 6 ). From this point of view, according to the embodiment, the discharge stop voltage Vmin is controlled so as be increased from a starting point of V1 as the charging/discharging history of the secondary battery 1 makes progress, as shown in FIG. 7. That is, similarly to the above-mentioned charging case, the number of charging/ discharging of the secondary battery 1 is also estimated as the cycle number N* by informations from the counters 5 and 11 and the traveling range is estimated by an information from the odometer 13.

Furthermore, by the information from the timer 12, it is estimated how long it has been passing since the secondary battery 1 is exchanged for the new one.

Then, giving priority to the estimated cycle number N*, the discharge stop voltage Vmin is heightened by a predetermined value corresponding to an increasing of the estimated cycle number N*, as shown with a continuous line of FIG. 7.

Next, in case that an accumulated value of the traveling range is relatively large in spite of the identical estimated cycle number N* or in case that the passage of time detected by the timer 12 is relatively long, an increasing ratio of the discharge stop voltage Vmin is further increased as shown with a broken line of FIG. 7.

By controlling the charge stop voltage Vmax and the discharge stop voltage Vmin in the above-mentioned manner, even when the charging/discharging history of the battery 1 makes progress, it is possible to avoid a gradual increasing of the deterioration rate in battery capacity, whereby the life span of the secondary battery can be extended certainly.

Note, in the embodiment, the switch 10, the control switch 7 and the controller 2 for controlling the switches 7 and 10 constitute means for controlling the discharging operation of the control device of the invention and on the other hand, the ON/OFF switch 4 and the controller 1 for controlling it constitute means for controlling the charging of the control device. In addition, the counters 5 and 11, the timer 12, the integrator 14, the traveling range data correction unit 15, the odometer 13 and the controller 2 constitute means for estimating the charging/discharging history of the secondary battery.

Figure 8:
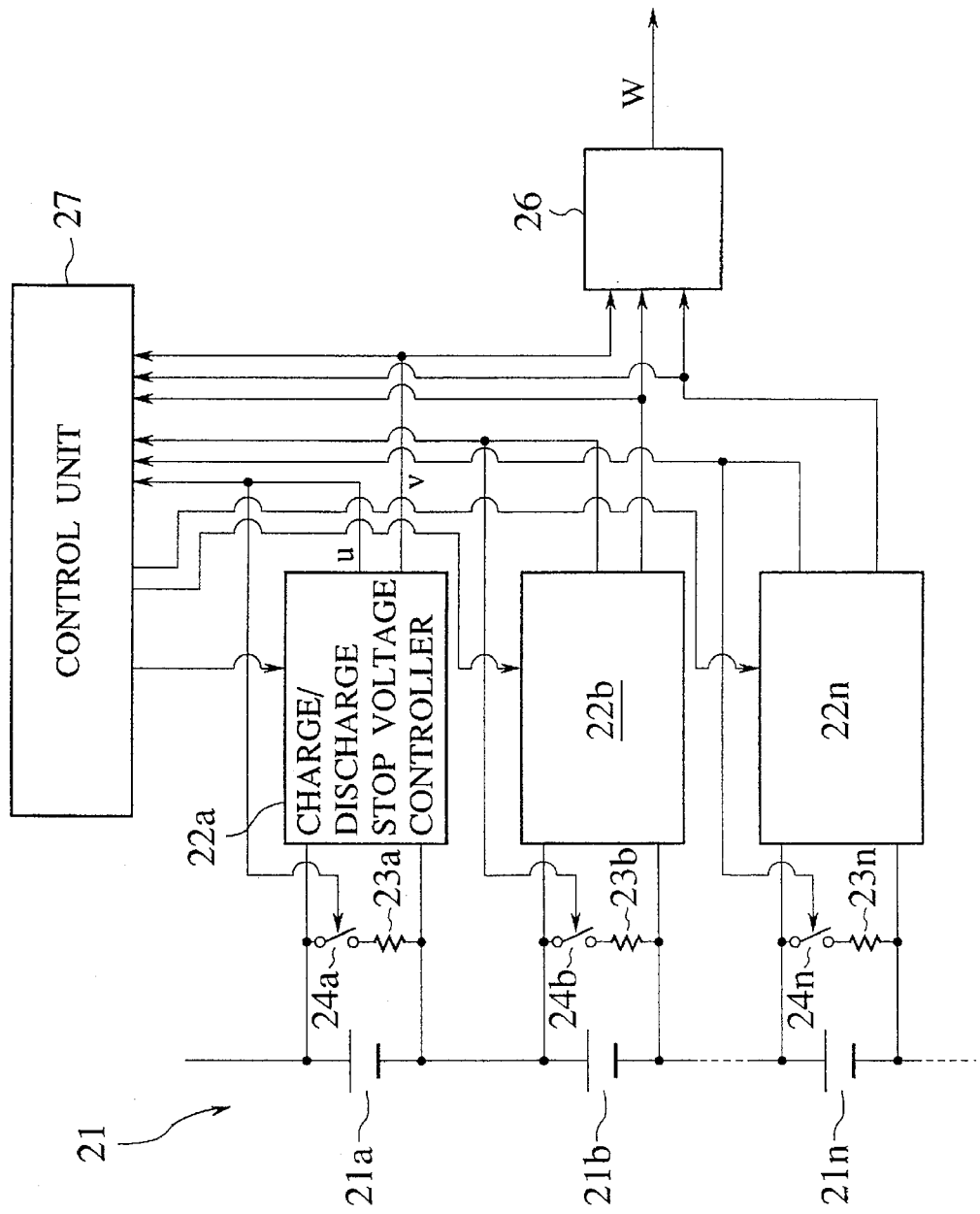
FIG. 8 is a view showing a charging and discharging control device in accordance with another embodiment of the present invention.

FIG. 8 shows another embodiment of the present invention, in which a plurality of secondary batteries are used as a builtup battery. Arranged corresponding to respective secondary batteries 21a, 21b, ... of the builtup battery 21 are by-pass circuits which include respective by-pass resistances 23a, 23b, ... and ON/OFF switches 24a, 24b, ... to thereby by-pass the charging current independently. Further, for every secondary batteries 21a, 21b, ..., "charge/discharge stop voltage" controllers 22a, 22b, ... are provided to detect voltages of the batteries 21a, 21b, ..., respectively.

The ON/OFF switches 24a, 24b, ... of the respective by-pass circuits are controlled by the charge/discharge stop voltage controllers 22a, 22b, ..., respectively. In charging, when the voltage of the specified secondary battery reaches the charge stop voltage Vmax, the corresponding charge/ discharge stop voltage controller outputs a charge stop signal u and then activates the corresponding ON/OFF switch thereby to change a flow of charging current into the corresponding by-pass resistance.

At discharging, when any one of the secondary batteries 21a, 21b, ... reaches the discharge stop voltage Vmin, the corresponding charge/discharge stop voltage controllers 22a, 22b, ..., outputs a discharge stop signal v, so that a discharging completion(end) signal w is outputted through an output circuit 26 thereby to stop the discharging operation as the builtup battery.

Under condition that voltage of any one of the secondary batteries reaches the discharge stop voltage Vmin, in case of stopping discharging, the output circuit 26 may be constructed as a OR circuit. Alternatively, when voltages of specified plural secondary batteries reach the respective discharge stop voltage Vmin, the discharging operation may be stopped. In such a case, the output circuit 26 may be constructed as an AND circuit.

A control unit 27 including a processor and a memory is provided to memorize the charge/discharge stop signals outputted from the charge/discharge stop voltage controllers 22a, 22b, ..., as an information of operational condition of the batteries. Based on the informations accumulated in this way, the control unit 27 operates to output command signals for correcting the respective charge/discharge stop voltages against the controllers 22a, 22b, ...

As mentioned above, at charging, when the voltage of battery is in excess of the charge stop voltage in any one of the secondary batteries, the corresponding ON/OFF switch (ex. the switch 24b) is turned on, so that the charging current is introduced into the corresponding by-pass resistance (ex. the resistance 23b). Consequently, the charging operation for the corresponding secondary battery (ex. the battery 21b) is ended and the charging current is directed to the other secondary batteries. In this way, all of the secondary batteries 21a, 21b, ... are charged up to the charge stop voltage finally.

The signal for activating the corresponding ON/OFF switch (ex. the switch 24b), which has been outputted from the corresponding charge/discharge stop voltage controller (ex. the controller 22b), is also inputted to the control unit 27 where it is memorized which of the controllers 22a, 22b, . . . is operated.

Figure 9:
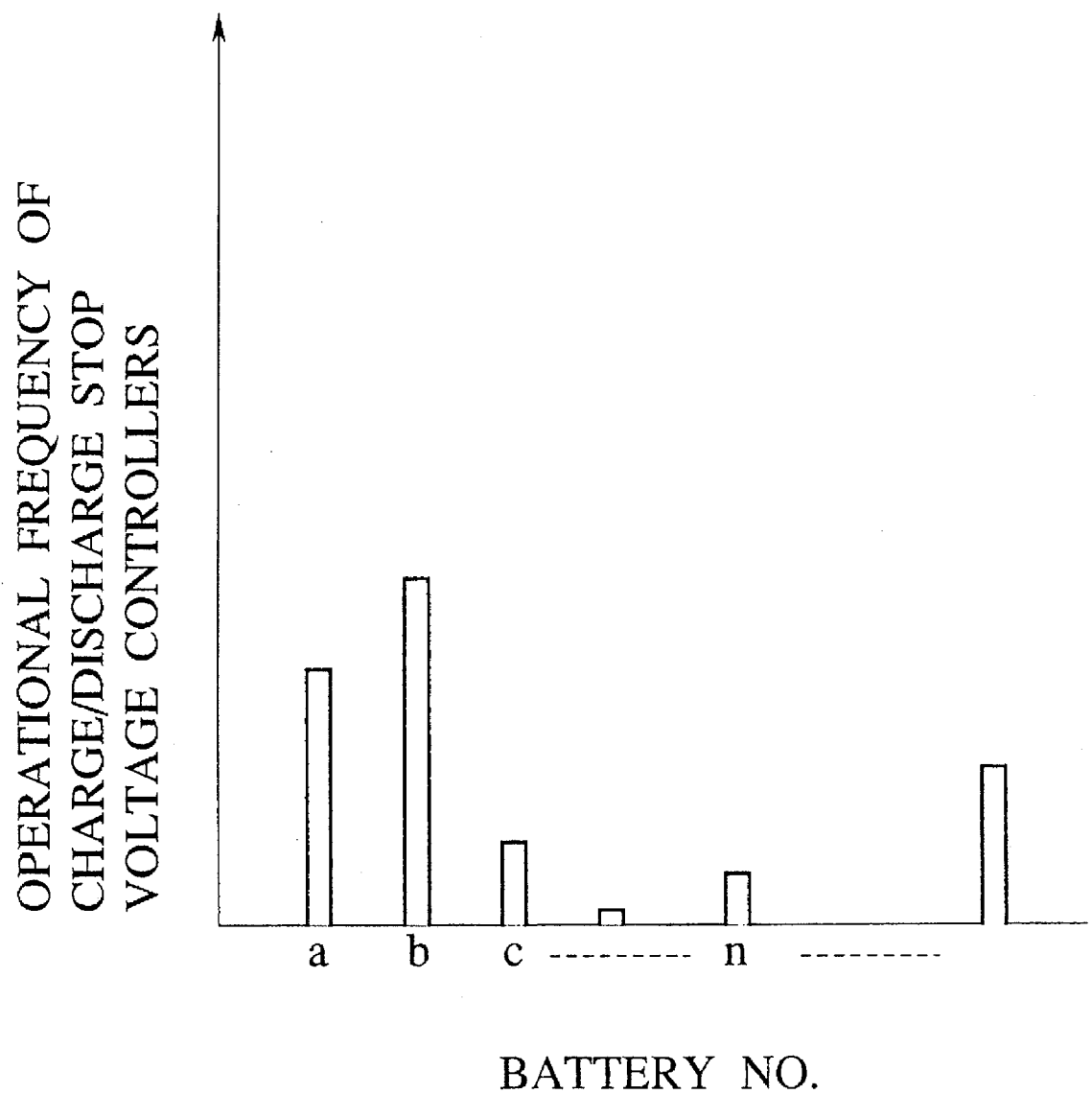
FIG. 9 is a diagram showing an example of operational frequency of charge/discharge stop voltage controllers of FIG. 8.

FIG. 9 shows an example of operational frequency of the above controllers, which is installed in the memory part of the control unit 27 at every secondary batteries. According to the shown example, it will be understood that the individual secondary battery 21b has a larger frequency value than any other batteries and it is estimated that the deterioration rate in battery capacity has already been large. Therefore, in this case, the charge stop voltage Vmax of the individual secondary battery 21b is adjusted to be decreased while the charging stop voltages of the other secondary batteries are established to be increased relatively, whereby the deterioration in capacity of the battery 21b is restrained thereby to equalize the difference in battery capacity among the whole secondary batteries 21a, 21b, ...

FIG. 10 is a flow chart of executing the above-mentioned establishment of the charge stop voltage.

At step 201, by the control unit 27, it is checked from which of the charge/discharge stop voltage controllers 22a, 22b, ..., the charge stop (ON) signal has been outputted. Hereat, on the presumption that the charge stop (ON) signal is outputted from the charge/discharge stop voltage controller 22n, in such a case, the routine goes to step 202. Then, at step 202, by comparing respective numbers of outputting of the charge stop signals outputted by the respective controllers 22a, 22b, ... 22n, ..., which numbers have been memorized in the control unit 27, with each other, it is judged whether or not the number of outputting corresponding to the above controller 22n is larger than any other numbers corresponding to the other controllers. In other words, at step 202, it is checked whether the deterioration in capacity of the corresponding secondary battery 21n is relatively large in comparison with those of the other batteries.

If the judgement at step 202 is Yes, that is, when the deterioration of the battery 21n is large, then the routine goes to step 203 where the control unit 27 outputs a command for correcting the charge stop voltage to the corresponding controller 22n. At sequent step 204, upon receiving the command, it is executed to establish the charge stop voltage reduced by a predetermined value α as a new charge stop voltage Vmax in the corresponding controller 22n.

That is, a fact that the number of outputting the charge stop signal generated by the controller 22n, i.e. the frequency of outputting, is relatively large, means that, in operation, the corresponding secondary battery 21n always reaches the charge stop voltage prior to the other batteries. In such a case, it can be supposed that the deterioration rate of the battery 21n is large in comparison with those of the other batteries. Therefore, according to the embodiment, the charge stop voltage is decreased so as to be a value of Vmax-α thereby to reduce the deterioration rate in battery capacity.

After replacing the charge stop voltage at step 204, the routine goes to end and thereafter, a newly established charge stop voltage Vmax will be a standard value for stopping the next charging operation against the secondary battery 21n.

Note that, regarding the above-mentioned flow chart, in. either case that it is judged at step 201 that no charge stop signal is inputted and that it is judged at step 202 that the deterioration in battery capacity is not so large, then the routine goes to end without correcting the present charge stop voltage.

Also at discharging, processes similar to the above-mentioned processes can be applied, so that the discharge stop voltage is corrected corresponding to the number of outputting the discharge stop signal. In this case, as the charging/discharging history of the battery makes progress, the discharge stop voltage Vmin is increased, as similar to the previous embodiment.

Additionaly, in this embodiment, the respective charge/ discharge stop voltage controllers 22a, 22b, . . . , each of which outputs the discharge stop signal when the corresponding secondary battery has the individual discharge stop voltage, and the output circuit 26 constitute means for controlling the discharging operation of the control device of the invention. On the other hand, the by-pass resistances 23a, 23b, . . . , the ON/OFF switches 24a, 24b, . . . and the respective charge/discharge stop voltage controllers 22a, 22b, . . . which control the ON/OFF switches constitute means for controlling the charging operation. Especially, the above by-pass resistances 23a, 23b, . . . and the ON/OFF switches 24a, 24b, . . . constitute means for change the flow of current.

In addition, the control unit 27, which outputs the correction command to the respective charge/discharge stop voltage controllers 22a, 22b, . . . on the basis of the number of outputting the charge stop signal, constitutes means for estimating the charging/discharging history of the secondary battery.

According to the embodiment, regarding the specified secondary battery which had the charge stop voltage prior to the other secondary batteries at charging, the flow of charging current therefor is changed to the other secondary batteries through the by-pass resistance by the charge stop signal outputted from the corresponding charge/discharge stop voltage controller. Furthermore, the respective charge stop voltages are corrected for every secondary batteries, on the basis of the number of outputting the charge stop signal. Consequently, It is possible to reduce a possibility of wasteful overcharging and to restrain an abrupt increasing of the deterioration in battery capacity of the secondary batteries, whereby the life span can be extended.

What is claimed is:

1. A charging and discharging control device for a secondary battery, said control device comprising:

discharging control means for stopping discharging of said secondary battery when a voltage thereof becomes less than a predetermined discharge stop voltage during discharging of said secondary battery;

charging control means for stopping charging of said secondary battery when the voltage thereof is in excess of a predetermined charge stop voltage during charging of said secondary battery; and history estimating means for estimating the charging/ discharging history of said secondary battery on the basis of condition thereof;

wherein said discharging control means corrects said predetermined discharge stop voltage so as to be increased corresponding to the charging/discharging history estimated by said history estimating means;

wherein said charging control means corrects said predetermined charge stop voltage so as to be decreased corresponding to the charging/discharging history estimated by said history estimating means, wherein said secondary battery consists of a plurality of secondary batteries connected with each other;

wherein said charging control means includes current changing means which, in case that a charging voltage in a specified secondary battery reaches said predetermined charge stop voltage, directs a flow of charging current to the other secondary batteries by a by-pass operation of the flow of charging current; and wherein said history estimating means estimates the charging/discharging history of said secondary battery on the basis of a number of said by-pass operations.

2. A charging and discharging control device for a secondary battery, said control device comprising:

discharging control means for stopping discharging of said secondary battery when a voltage thereof becomes less than a predetermined discharge stop voltage during discharging of said secondary battery;

charging control means for stopping charging of said secondary battery when the voltage thereof is in excess of a predetermined charge stop voltage during charging of said secondary battery; and history estimating means for estimating the charging/ discharging history of said secondary battery on the basis of condition thereof;

wherein said discharging control means corrects said predetermined discharge stop voltage so as to be increased corresponding to the charging/discharging history estimated by said history estimating means;

wherein said charging control means corrects said predetermined charge stop voltage so as to be decreased corresponding to the charging/discharging history estimated by said history estimating means, and wherein said secondary battery is used for driving a vehicle and wherein said history estimating means estimates the charging/discharging history of said secondary battery on the basis of a period of using thereof, a number of cycles between charging and discharging and a traveling range of the vehicle.

3. A charging and discharging control device for a secondary battery as claimed in claim 2, wherein said discharging control means comprises a control switch electrically arranged between a discharge load and said secondary battery to connect it with the discharge load and a controller for controlling the ON/OFF operation of said control switch and wherein said charging control means comprises an ON/OFF switch electrically arranged between said secondary battery and a charging unit for charging said secondary battery to connect it with said charging unit and said controller for controlling the ON/OFF operation of said ON/OFF switch.

4. A charging and discharging control devices for a secondary battery as claimed in claim 3, wherein said history estimating means comprises counters for counting the number of ON/OFF conditions in said ON/OFF switch and said control switch, a timer for detecting a passage of time since said secondary battery has been exchanged for a new one and an odometer for detecting a traveling range of the vehicle.

5. A charging and discharging control device for a secondary battery as claimed in claim 4, wherein said history estimating means further comprises a correction unit for correcting said traveling range with an acceleration of said vehicle.

* * * * *